US012354644B2

United States Patent
Dhori et al.

(10) Patent No.: US 12,354,644 B2
(45) Date of Patent: Jul. 8, 2025

(54) ADAPTIVE WORD LINE UNDERDRIVE CONTROL FOR AN IN-MEMORY COMPUTE OPERATION WHERE SIMULTANEOUS ACCESS IS MADE TO PLURAL ROWS OF A STATIC RANDOM ACCESS MEMORY (SRAM)

(71) Applicant: STMicroelectronics International N.V., Geneva (CH)

(72) Inventors: Kedar Janardan Dhori, Ghaziabad (IN); Nitin Chawla, Noida (IN); Promod Kumar, Greater Noida (IN); Manuj Ayodhyawasi, Noida (IN); Harsh Rawat, Faridabad (IN)

(73) Assignee: STMicroelectronics International N.V., Geneva (CH)

( * ) Notice: Subject to any disclaimer, the term of this patent is extended or adjusted under 35 U.S.C. 154(b) by 175 days.

(21) Appl. No.: 17/844,434

(22) Filed: Jun. 20, 2022

(65) Prior Publication Data

US 2023/0008275 A1 Jan. 12, 2023

Related U.S. Application Data

(60) Provisional application No. 63/220,152, filed on Jul. 9, 2021.

(51) Int. Cl.
*G11C 11/54* (2006.01)
*G11C 7/04* (2006.01)
(Continued)

(52) U.S. Cl.
CPC .......... *G11C 11/4085* (2013.01); *G11C 7/04* (2013.01); *G11C 11/4074* (2013.01);
(Continued)

(58) Field of Classification Search
CPC .......... G11C 11/4085; G11C 11/4125; G11C 11/419; G11C 11/54; G11C 8/08; G11C 11/418; G06F 11/3058; G06F 12/1009
See application file for complete search history.

(56) References Cited

U.S. PATENT DOCUMENTS 6,198,671 B1 3/2001 Aoyama et al.
6,282,137 B1 8/2001 Lee et al.
(Continued)

FOREIGN PATENT DOCUMENTS

CN 101479803 A * 7/2009 .......... G11C 11/417
CN 110503995 A 11/2019
(Continued)

OTHER PUBLICATIONS

Luo, Shien-Chun, et al: "A Subthreshold SRAM Cell with Autonomous Bitline-Voltage Clamping," 2010 IEEE.
(Continued)

*Primary Examiner* — Mushfique Siddique
(74) *Attorney, Agent, or Firm* — Crowe & Dunlevy LLC

(57) ABSTRACT

An in-memory computation circuit includes a memory array with SRAM cells connected in rows by word lines and in columns by bit lines. Each row includes a word line drive circuit powered by an adaptive supply voltage. A row controller circuit simultaneously actuates word lines in parallel for an in-memory compute operation. A column processing circuit processes analog voltages developed on the bit lines in response to the simultaneous actuation to generate a decision output for the in-memory compute operation. A voltage generator circuit generates the adaptive supply voltage for powering the word line drive circuits during the simultaneous actuation. A level of the adaptive supply voltage is modulated dependent on integrated circuit process and/or temperature conditions in order to optimize (Continued)

word line underdrive performance and inhibit unwanted memory cell data flip.

30 Claims, 6 Drawing Sheets

(51) Int. Cl.
G11C 11/4074 (2006.01)
G11C 11/4076 (2006.01)
G11C 11/408 (2006.01)
G11C 11/412 (2006.01)
G11C 11/419 (2006.01)
H03K 19/17728 (2020.01)
G11C 8/08 (2006.01)

(52) U.S. Cl.
CPC ...... *G11C 11/4076* (2013.01); *G11C 11/4125* (2013.01); *G11C 11/419* (2013.01); *G11C 11/54* (2013.01); *H03K 19/17728* (2013.01); *G11C 8/08* (2013.01)

(56) References Cited

U.S. PATENT DOCUMENTS

| | | | |
|---|---|---|---|
| 6,529,400 B1 | 3/2003 | Bhavnagarwala et al. | |
| 6,785,161 B2 | 8/2004 | Pekny | |
| 7,120,061 B2 | 10/2006 | Daga | |
| 7,173,837 B1 | 2/2007 | Bettman et al. | |
| 7,227,769 B2 | 6/2007 | Fukushi et al. | |
| 7,289,354 B2 | 10/2007 | Houston | |
| 7,342,845 B2 | 3/2008 | Somasekhar et al. | |
| 7,502,247 B2 | 3/2009 | Houston | |
| 7,508,697 B1* | 3/2009 | Mukhopadhyay ... | G11C 29/028 365/189.09 |
| 7,525,834 B2 | 4/2009 | Sohn | |
| 7,564,725 B2 | 7/2009 | Houston | |
| 7,570,527 B2 | 8/2009 | Houston | |
| 7,742,326 B2 | 6/2010 | Houston | |
| 7,760,575 B2 | 7/2010 | Tooher et al. | |
| 7,773,407 B2 | 8/2010 | Huang et al. | |
| 7,813,163 B2 | 10/2010 | Pille et al. | |
| 8,004,907 B2 | 8/2011 | Russell et al. | |
| 8,064,241 B2 | 11/2011 | Morita et al. | |
| 8,134,874 B2 | 3/2012 | Shiu et al. | |
| 8,213,257 B2 | 7/2012 | Chuang et al. | |
| 8,441,829 B2* | 5/2013 | Huang ................. | G11C 11/412 365/49.41 |
| 8,451,652 B2 | 5/2013 | Seikh et al. | |
| 8,559,248 B2 | 10/2013 | Dally et al. | |
| 8,947,970 B2 | 2/2015 | Pelley et al. | |
| 8,966,329 B2 | 2/2015 | Clark et al. | |
| 8,971,146 B2 | 3/2015 | Sharpe-Geisler et al. | |
| 9,001,579 B2 | 4/2015 | Song et al. | |
| 9,013,949 B2 | 4/2015 | Schreiber et al. | |
| 9,087,566 B2 | 7/2015 | Song et al. | |
| 9,142,284 B2 | 9/2015 | Lee et al. | |
| 9,147,451 B2 | 9/2015 | Chong et al. | |
| 9,263,121 B2 | 2/2016 | Karl et al. | |
| 9,286,952 B2 | 3/2016 | McLaury | |
| 9,336,865 B1 | 5/2016 | Chu et al. | |
| 9,455,023 B1 | 9/2016 | Xu et al. | |
| 9,799,393 B1 | 10/2017 | Ramamurthy et al. | |
| 9,831,852 B2 | 11/2017 | Boakye et al. | |
| 9,928,898 B2* | 3/2018 | Sahu .................. | G11C 8/08 |
| 9,953,699 B2 | 4/2018 | Ichihashi | |
| 9,953,986 B2 | 4/2018 | Wang | |
| 9,997,236 B1* | 6/2018 | Pathak ................. | G11C 11/419 |
| 10,319,434 B2 | 6/2019 | Jung et al. | |
| 10,403,629 B2 | 9/2019 | Mann et al. | |
| 10,541,013 B1 | 1/2020 | Schreiber et al. | |
| 10,559,573 B2 | 2/2020 | Wang et al. | |
| 10,642,922 B2 | 5/2020 | Knag et al. | |
| 10,650,909 B2 | 5/2020 | Chen et al. | |
| 10,679,694 B2 | 6/2020 | Kumar et al. | |
| 10,685,703 B2 | 6/2020 | Singh et al. | |
| 10,748,911 B2 | 8/2020 | Singh et al. | |
| 10,796,732 B2 | 10/2020 | Yoshihara et al. | |
| 10,811,088 B2 | 10/2020 | Raj et al. | |
| 11,048,434 B2 | 6/2021 | Kumar et al. | |
| 12,087,356 B2* | 9/2024 | Rawat ................. | G11C 8/08 |
| 2002/0105825 A1* | 8/2002 | Marshall .................. | G11C 8/08 365/154 |
| 2006/0044018 A1 | 3/2006 | Chang | |
| 2008/0037358 A1* | 2/2008 | Yabuuchi ................ | G11C 8/08 365/230.06 |
| 2008/0144365 A1 | 6/2008 | Yamaoka et al. | |
| 2009/0046519 A1 | 2/2009 | Wang et al. | |
| 2011/0261633 A1 | 10/2011 | Chandra et al. | |
| 2014/0185364 A1 | 7/2014 | Iyer et al. | |
| 2014/0204657 A1 | 7/2014 | Dally | |
| 2015/0179232 A1 | 6/2015 | Felix et al. | |
| 2016/0232951 A1 | 8/2016 | Shanbhag et al. | |
| 2018/0012648 A1 | 1/2018 | Ichihashi | |
| 2019/0042160 A1 | 2/2019 | Kumar et al. | |
| 2019/0042199 A1* | 2/2019 | Sumbul .................... | G11C 8/10 |
| 2019/0198093 A1 | 6/2019 | Khellah et al. | |
| 2020/0075090 A1 | 3/2020 | Kumar et al. | |
| 2020/0082876 A1 | 3/2020 | Singh et al. | |
| 2021/0035614 A1 | 2/2021 | Schreiber | |

FOREIGN PATENT DOCUMENTS

| | | | |
|---|---|---|---|
| EP | 0461430 A1 | 12/1991 | |
| EP | 3437098 B1 | 7/2019 | |
| JP | 5158624 B2 * | 3/2013 | ............. G11C 11/41 |
| KR | 1020200091697 A | 7/2020 | |
| WO | 0051131 A1 | 8/2000 | |

OTHER PUBLICATIONS

Lorenzo, Rohit, et al: "A novel 9T SRAM architecture for low leakage and high performance," Analog Integrated Circuits and Signal Processing, 92, 315-325 (2017).

Kushwah, C.B., et al: "Single-Ended Boost-Less (SE-BL) 7T Process Tolerant SRAM Design in Sub-threshold Regime for Ultra-Low-Power Applications," Springer Link, Jun. 3, 2015.

Lin, Zhiting, et al.: "Cascade Current Mirror to Improve Linearity and Consistency in SRAM In-Memory Computing," IEEE Journal of Solid-State Circuits, vol. 56, No. 8, Aug. 2021, 13 pgs.

Zhang, Jintao, et al.: "In-Memory Computation of a Machine-Learning Classifier in a Standard 6T SRAM Array," IEEE Journal of Solid-State Circuits, vol. 52, No. 4, Apr. 2017, 10 pgs.

Definition of "Buffer Amplifier," Wikipedia, 2021, 6 pgs.

Chang, Chip-Hong, et al.: "Sizing of SRAM Cell with Voltage Biasing Techniques for Reliability Enhancement of Memory and PUF Functions," Journal of Low Power Electronics and Applications, 2016, 6, 16; doi: 10.3390/jlpea6030016, 17 pgs.

Agrawal, Amogh, et al: X-SRAM: Enabling In-Memory Boolean Computations in CMOS Static Random Access Memories, IEEE Transactions on Circuits and Systems—I: Regular Papers, vol. 65, No. 12, Dec. 2018.

Biswas, Avishek, et al: CONF-SRAM: An Energy-Efficient SRAM With In-Memory Dot-Product Computation for Low-Power Convolution for Low-Power Convolutional Neural Networks, IEEE Journal of Solid-State Circuits, vol. 54, No. 1, Jan. 2019.

Biswas, Avishek: "Energy-Efficient Smart Embedded Memory Design for IoT and AI," Massachusetts Institute of Technology, Jun. 2018.

Dong, Qing, et al: A 351TOPS/W and 372.4GOPS Compute-in-Memory SRAM Macro in 6nm FinFET CMOS for Machine-Learning Applications, ISSCC 2020, Session 15, SRAM & Compute-in-Memory, 15.3.

H. Jia et al., 15.1 A Programmable Neural-Network Inference Accelerator Based on Scalable In-Memory Computing, 2021 IEEE International Solid-State Circuits Conference (ISSCC), 2021, pp. 236-238, doi: 10.1109/ISSCC42613.2021.9365788.

H. Jia et al., Scalable and Programmable Neural Network Inference Accelerator Based on In-Memory Computing, in IEEE Journal of Solid-State Circuits, vol. 57, No. 1, pp. 198-211, Jan. 2022, doi: 10.1109/JSSC.2021.3119018.

(56) References Cited

OTHER PUBLICATIONS

J.-W. Su et al., 16.3 A 28nm 384kb 6T-SRAM Computation-in-Memory Macro with 8b Precision for AI Edge Chips, 2021 IEEE International Solid-State Circuits Conference (ISSCC), 2021, pp. 250-252, doi: 10.1109/ISSCC42613.2021.9365984.

J. Lee, H. Valavi, Y. Tang and N. Verma, Fully Row/Column-Parallel In-memory Computing SRAM Macro employing Capacitor-based Mixed-signal Computation with 5-b Inputs, 2021 Symposium on VLSI Circuits, 2021, pp. 1-2, doi: 10.23919/VLSICircuits52068.2021.9492444.

Jia, Hongyang, et al: A Microprocessor Implemented in 65nm CMOS with Configurable and Bit-scalable Accelerator for Programmable In-memory Computing, IEEE Journal of Solid-State Circuits, vol. 55, No. 9, pp. 2609-2621, Sep. 2020.

Jia, Hongyang, et al: A Programmable Heterogeneous Microprocessor Based on Bit-Scalable In-Memory Computing, IEEE Journal of Solid-State Circuits, vol. 55, No. 9, Sep. 2020.

Jiang, Zhewei, et al: C3SRAM: An In-Memory-Computing SRAM Macro Based on Robust Capacitive Coupling Computing Mechanism, IEEE Journal of Solid-State Circuits, vol. 55, No. 7, Jul. 2020.

Kang, Mingu, et al: A Multi-Functional In-Memory Inference Processor Using a Standard 6T SRAM Array, IEEE Journal of Solid-State Circuits, vol. 53, No. 2, Feb. 2018.

Kim, Jinseok, et al: Area-Efficient and Variation-Tolerant In-Memory BNN Computing using 6T SRAM Array, 2019 Symposium on VLSI Circuits Digest of Technical Papers.

Si, Xin, et al: A 28nm 64Kb 6T SRAM Computing-in-Memory Macro with 8b MAC Operation for AI Edge Chips, ISSCC 2020, Session 15, SRAM & Compute-in-Memorya, 15.5.

Si, Xin, et al: A Twin-8T SRAM Computation-In-Memory Macro for Multipe-Bit CNN-Based Machine Learning, ISSCC 2019, Session 24, SRAM & Computation-in-Memory, 24.5.

Singh, Jawar, et al: "A 2-Port 6T SRAM Bitcell Design with Multi-Port Capabilities at Reduced Area Overhead," 2010 IEEE.

Su, Jian-Wei, et al: A 28nm 64Kb Inference-Taining Two-Way Transpose Multibit 6T SRAM Compute-in-Memory Macro for AI Edge Chips, ISSCC 2020, Session 15, SRAM & Compute-in-Memory, 15.2.

V. K. Rajanna, S. Taneja and M. Alioto, SRAM with In-Memory Inference and 90% Bitline Activity Reduction for Always-On Sensing with 109 TOPS/mm2 and 749-1,459 TOPS/W in 28nm, ESSDERC 2021—IEEE 51st European Solid-State Device Research Conference (ESSDERC), 2021, pp. 127-130, doi: 10.1109/ESSDERC53440.2021.9631782.

Valavi, Hossein, et al: A 64-Tile 2.4-Mb In-Memory-Computing CNN Accelerator Employing Charge-Domain Compute, IEEE Journal of Solid-State Circuits, vol. 54, No. 6, Jun. 2019.

Y.-D. Chih et al., 16.4 An 89TOPS/W and 16.3TOPS/mm2 All-Digital SRAM-Based Full-Precision Compute-In Memory Macro in 22nm for Machine-Learning Edge Applications, 2021 IEEE International Solid-State Circuits Conference (ISSCC), 2021, pp. 252-254, doi: 10.1109/ISSCC42613.2021.9365766.

Yin, Shihui, et al: XNOR-SRAM: In-Memory Computing SRAM Macro for Binary/Ternary Deep Neural Networks, IEEE Journal of So.id-State Circuits, vol. 55, No. 6, Jun. 2020.

Z. Chen, X. Chen and J. Gu, 15.3 A 65nm 3T Dynamic Analog RAM-Based Computing-in-Memory Macro and CNN Accelerator with Retention Enhancement, Adaptive Analog Sparsity and 44TOPS/W System Energy Efficiency, 2021 IEEE International Solid-State Circuits Conference (ISSCC), 2021, pp. 240-242, doi: 10.1109/ISSCC42613.2021.9366045.

Zhang, Jintao, et al: In-Memory Computation of a Machine-Learning Classifier in a Standard 6T SRAM Array, IEEE Journal of Solid-State Circuits, vol. 52, No. 4, Apr. 2017.

* cited by examiner

ADAPTIVE WORD LINE UNDERDRIVE CONTROL FOR AN IN-MEMORY COMPUTE OPERATION WHERE SIMULTANEOUS ACCESS IS MADE TO PLURAL ROWS OF A STATIC RANDOM ACCESS MEMORY (SRAM)

CROSS REFERENCE TO RELATED APPLICATIONS

This application claims priority from United States Application for Patent No. 63/220,152, filed Jul. 9, 2021, the disclosure of which is incorporated by reference.

TECHNICAL FIELD

Embodiments relate to an in-memory computation circuit utilizing a static random access memory (SRAM) array and, in particular, to exercising adaptive word line underdrive control during a simultaneous access of multiple rows of the SRAM array for an in-memory compute operation.

BACKGROUND

Reference is made to FIG. 1 which shows a schematic diagram of an in-memory computation circuit 10. The circuit 10 utilizes a static random access memory (SRAM) array 12 formed by standard 6T SRAM memory cells 14 arranged in a matrix format having N rows and M columns. As an alternative, a standard 8T memory cell or an SRAM with a similar functionality and topology could instead be used. Each memory cell 14 is programmed to store a bit of a computational weight for an in-memory compute operation. In this context, the in-memory compute operation is understood to be a form of a high dimensional Matrix Vector Multiplication (MVM) supporting multi-bit weights that are stored in multiple bit cells of the memory. The group of bit cells (in the case of a multibit weight) can be considered as a virtual synaptic element. Each bit of the computational weight has either a logic "1" or a logic "0" value.

Each SRAM cell 14 includes a word line WL and a pair of complementary bit lines BLT and BLC. The 8T-type SRAM cell would additionally include a read word line RWL and a read bit line RBT. The cells 14 in a common row of the matrix are connected to each other through a common word line WL (and through the common read word line RWL in the 8T-type implementation). The cells 14 in a common column of the matrix are connected to each other through a common pair of complementary bit lines BLT and BLC (and through the common read bit line RBL in the 8T-type implementation). Each word line WL, RWL is driven by a word line driver circuit 16 which may be implemented as a CMOS driver circuit (for example, a series connected p-channel and n-channel MOSFET transistor pair forming a logic inverter circuit). The word line signals applied to the word lines, and driven by the word line driver circuits 16, are generated from feature data input to the in-memory computation circuit 10 and controlled by a row controller circuit 18. A column processing circuit 20 senses the analog signal voltages on the pairs of complementary bit lines BLT and BLC (and/or on the read bit line RBL) for the M columns and generates a decision output for the in-memory compute operation from those analog signal voltages. The column processing circuit 20 can be implemented to support processing where the voltages on the columns are first processed individually and then followed by a recombination of multiple column outputs.

Although not explicitly shown in FIG. 1, it will be understood that the circuit 10 further includes conventional row decode, column decode, and read-write circuits known to those skilled in the art for use in connection with writing bits of the computational weight to, and reading bits of the computational weight from, the SRAM cells 14 of the memory array 12.

With reference now to FIG. 2, each memory cell 14 includes two cross-coupled CMOS inverters 22 and 24, each inverter including a series connected p-channel and n-channel MOSFET transistor pair. The inputs and outputs of the inverters 22 and 24 are coupled to form a latch circuit having a true data storage node QT and a complement data storage node QC which store complementary logic states of the stored data bit. The cell 14 further includes two transfer (passgate) transistors 26 and 28 whose gate terminals are driven by a word line WL. The source-drain path of transistor 26 is connected between the true data storage node QT and a node associated with a true bit line BLT. The source-drain path of transistor 28 is connected between the complement data storage node QC and a node associated with a complement bit line BLC. The source terminals of the p-channel transistors 30 and 32 in each inverter 22 and 24 are coupled to receive a high supply voltage (for example, Vdd) at a high supply node, while the source terminals of the n-channel transistors 34 and 36 in each inverter 22 and 24 are coupled to receive a low supply voltage (for example, ground (Gnd) reference) at a low supply node. While FIG. 2 is specific to the use of 6T-type cells, those skilled in the art recognize that the 8T-type cell is similarly configured and would further include a signal path that is coupled to one of the storage nodes and includes a transfer (passgate) transistor coupled to the read word line RWL and gate driven by the signal on the read word line RWL. The word line driver circuit 16 is also typically coupled to receive the high supply voltage (Vdd) at the high supply node and is referenced to the low supply voltage (Gnd) at the low supply node.

The row controller circuit 18 performs the function of selecting which ones of the word lines WL<0> to WL<N-1> are to be simultaneously accessed (or actuated) in parallel during an in-memory compute operation, and further functions to control application of pulsed signals to the word lines in accordance with the feature data for that in-memory compute operation. FIG. 1 illustrates, by way of example only, the simultaneous actuation of all N word lines with the pulsed word line signals, it being understood that in-memory compute operations may instead utilize a simultaneous actuation of fewer than all rows of the SRAM array. The analog signal voltages which develop on a given pair of complementary bit lines BLT and BLC (or develop on the read bit line RBL in the 8T-type implementation) are dependent on the logic state of the bits of the computational weight stored in the memory cells 14 of the corresponding column and the width(s) of the pulsed word line signals for the feature data applied to those memory cells 14.

The implementation illustrated in FIG. 1 shows an example in the form of a pulse width modulation (PWM) for the applied word line signals for the in-memory compute operation. The use of PWM or period pulse modulation (PTM) for the applied word line signals is a common technique used for the in-memory compute operation based on the linearity of the vector for the multiply-accumulation (MAC) operation. The pulsed word line signal format can be further evolved as an encoded pulse train to manage block sparsity of the feature data of the in-memory compute operation. It is accordingly recognized that an arbitrary set of encoding schemes for the applied word line signals can be used when simultaneously driving multiple word lines. Furthermore, in a simpler implementation, it will be understood that all applied word line signals in the simultaneous actuation may instead have a same pulse width.

FIG. 3 is a timing diagram showing simultaneous application of the example pulse width modulated word line signals for the feature data to plural rows of memory cells 14 in the SRAM array 12 for a given in-memory compute operation, and the development over time of the analog signal voltages Va,T and Va,C on one corresponding pair of complementary bit lines BLT and BLC, respectively, in response to the pulse width(s) of those word line signals and the logic state of the bits of the computational weight stored in the memory cells 14. The representation of the analog voltage Va levels as shown is just an example. After completion of the computation cycle of the in-memory compute operation, the analog voltage Va levels return to the bit line precharge Vdd level. It will be noted that a risk exists that the analog voltage on at least one of the bit lines BLT and BLC may fall from the Vdd voltage to a level where an unwanted data flip occurs with respect to the stored data bit value in one of the memory cells 14 of the column. For example, a logic "1" state stored in the cell 14 of a column may be flipped to a logic "0" state. This data flip introduces a data error in the computational weight stored in the memory cells, thus jeopardizing the accuracy of subsequent in-memory compute operations.

The unwanted data flip that occurs due to an excess of bit line voltage lowering is mainly an effect of the simultaneous parallel access of the word lines in matrix vector multiplication mode during the in-memory compute operation. This problem is different from normal data flip of an SRAM bit cell due to Static-Noise-Margin (SNM) issues which happens in serial bit cell access when the bit line is close to the level of the supply voltage Vdd. During serial access, the normal data flip is instead caused by a ground bounce of the data storage nodes QT or QC.

A known solution to address the serial bit cell access SNM failure concern is to lower the word line voltage by a small amount and this is generally achieved by a short circuit of the word line driver and the use of a bleeder path. However, parallel access of multiple word lines during an in-memory compute operation instead needs a Radical-WL Lowering/Modulation (RWLM) technique. Additionally, a known solution to address the foregoing problem is to apply a fixed word line voltage lowering (for example, to apply a voltage $V_{WLUD}$ equal to Vdd/2) on all integrated circuit process corners in order to secure the worst integrated circuit process corner. This word line underdrive (WLUD) solution, however, has a known drawback in that there is a corresponding reduction in read current on the bit lines which can have a negative impact on computation performance. Furthermore, the use of a fixed word line underdrive voltage can increase variability of the read current across the array leading to accuracy loss for the in-memory compute operation.

Another solution is to utilize a specialized bitcell circuit design for each memory cell 14 that is less likely to suffer from an unwanted data flip during simultaneous (parallel) access of multiple rows for the in-memory compute operation. A concern with this solution is an increase in occupied circuit area for such a bitcell circuit. It would be preferred for some in-memory computation circuit applications to retain the advantages provided by use of the standard 6T SRAM cell (FIG. 2) or 8T SRAM cell or topologically similar bit cell in the array 12.

There is accordingly a need in the art to support in-memory computation circuit use of a standard 6T (or 8T) SRAM cell while ensuring against unwanted data flip during simultaneous row access.

SUMMARY

In an embodiment, an in-memory computation circuit comprises: a memory array including a plurality of static random access memory (SRAM) cells arranged in a matrix with plural rows and plural columns, each row including a word line connected to the SRAM cells of the row, and each column including a pair of bit lines connected to the SRAM cells of the column; a word line drive circuit for each row having an output connected to drive the word line of the row, wherein the word line drive circuit is powered by an adaptive supply voltage; a row controller circuit configured to simultaneously actuate the plurality of word lines by applying pulses through the word line driver circuits to the word lines for an in-memory compute operation; a column processing circuit connected to the pair of bit lines for each column and configured to process analog voltages developed on the pairs of bit lines in response to the simultaneous actuation of the plurality of word lines to generate a decision output for the in-memory compute operation; and a voltage generator circuit configured to generate the adaptive supply voltage for powering the word line drive circuits during the simultaneous actuation of the plurality of word lines for the in-memory compute operation, said adaptive supply voltage having a level which is dependent on integrated circuit process and/or temperature conditions.

In an embodiment, an in-memory computation circuit comprises: a memory array including a plurality of static random access memory (SRAM) cells arranged in a matrix with plural rows and plural columns, each row including a word line connected to the SRAM cells of the row, and each column including a pair of bit lines connected to the SRAM cells of the column; a word line drive circuit for each row having an output connected to drive the word line of the row; a row controller circuit configured to simultaneously actuate the plurality of word lines by applying pulses through the word line driver circuits to word lines for an in-memory compute operation; a column processing circuit connected to the pair of bit lines for each column and configured to process analog voltages developed on the pairs of bit lines in response to the simultaneous actuation of the plurality of word lines to generate a decision output for the in-memory compute operation; a bleeder transistor for each word line, wherein each bleeder transistor has a source-drain path coupled between the word line and a reference voltage node and a gate configured to receive an adaptive bias voltage; and a voltage generator circuit configured to generate the adaptive bias voltage during the simultaneous actuation of the plurality of word lines for the in-memory compute operation, said adaptive bias voltage having a level which is dependent on integrated circuit process and/or temperature conditions.

In an embodiment, an in-memory computation circuit comprises: a memory array including a plurality of static random access memory (SRAM) cells arranged in a matrix with plural rows and plural columns, each row including a word line connected to the SRAM cells of the row, and each column including a pair of bit lines connected to the SRAM cells of the column; a word line drive circuit for each row having an output connected to drive the word line of the row, wherein the word line drive circuit is powered by an adaptive supply voltage; a row controller circuit configured to simultaneously actuate the plurality of word lines by applying pulses through the word line driver circuits to the word lines for an in-memory compute operation; a column processing circuit connected to the pair of bit lines for each column and configured to process analog voltages developed on the pairs of bit lines in response to the simultaneous actuation of the plurality of word lines to generate a decision output for the in-memory compute operation; a replica circuit that replicates a passgate transistor and pull down transistor of the SRAM cells; a current generator configured to apply a force current to the replica circuit to generate a bias voltage; and a voltage circuit configured to use the bias voltage to generate the adaptive supply voltage for powering the word line drive circuits during the simultaneous actuation of the plurality of word lines for the in-memory compute operation, said adaptive supply voltage having a level which is dependent on integrated circuit process and/or temperature conditions.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
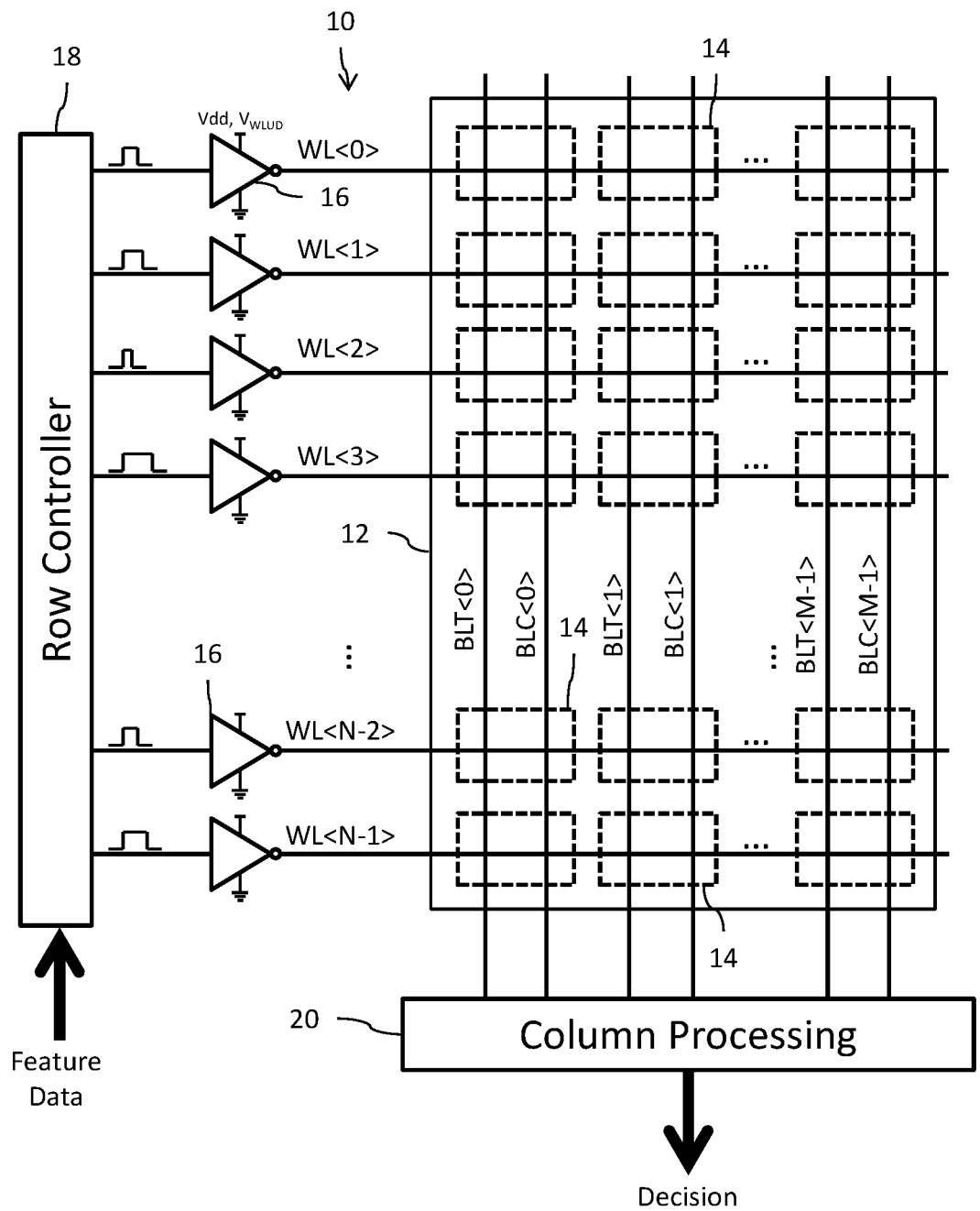
FIG. 1 is a schematic diagram of an in-memory computation circuit.
Figure 2:
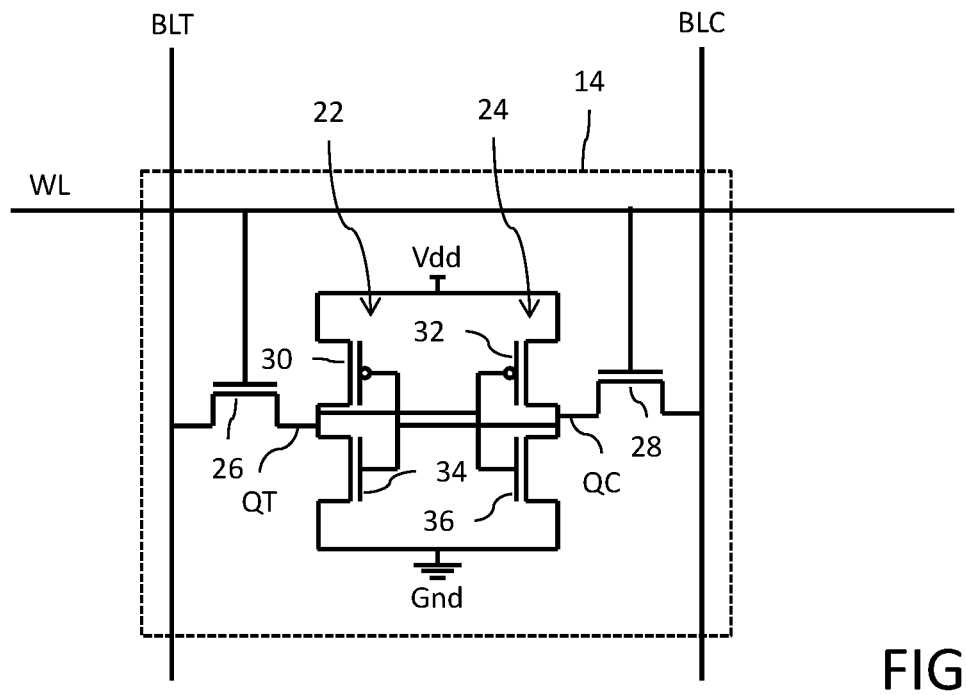
FIG. 2 is a circuit diagram of a standard 6T static random access memory (SRAM) cell as used the memory array of the in-memory computation circuit shown in FIG. 1.
Figure 3:
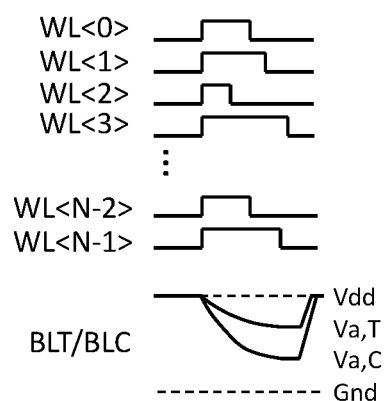
FIG. 3 is a timing diagram illustrating an in-memory compute operation.
Figure 4:
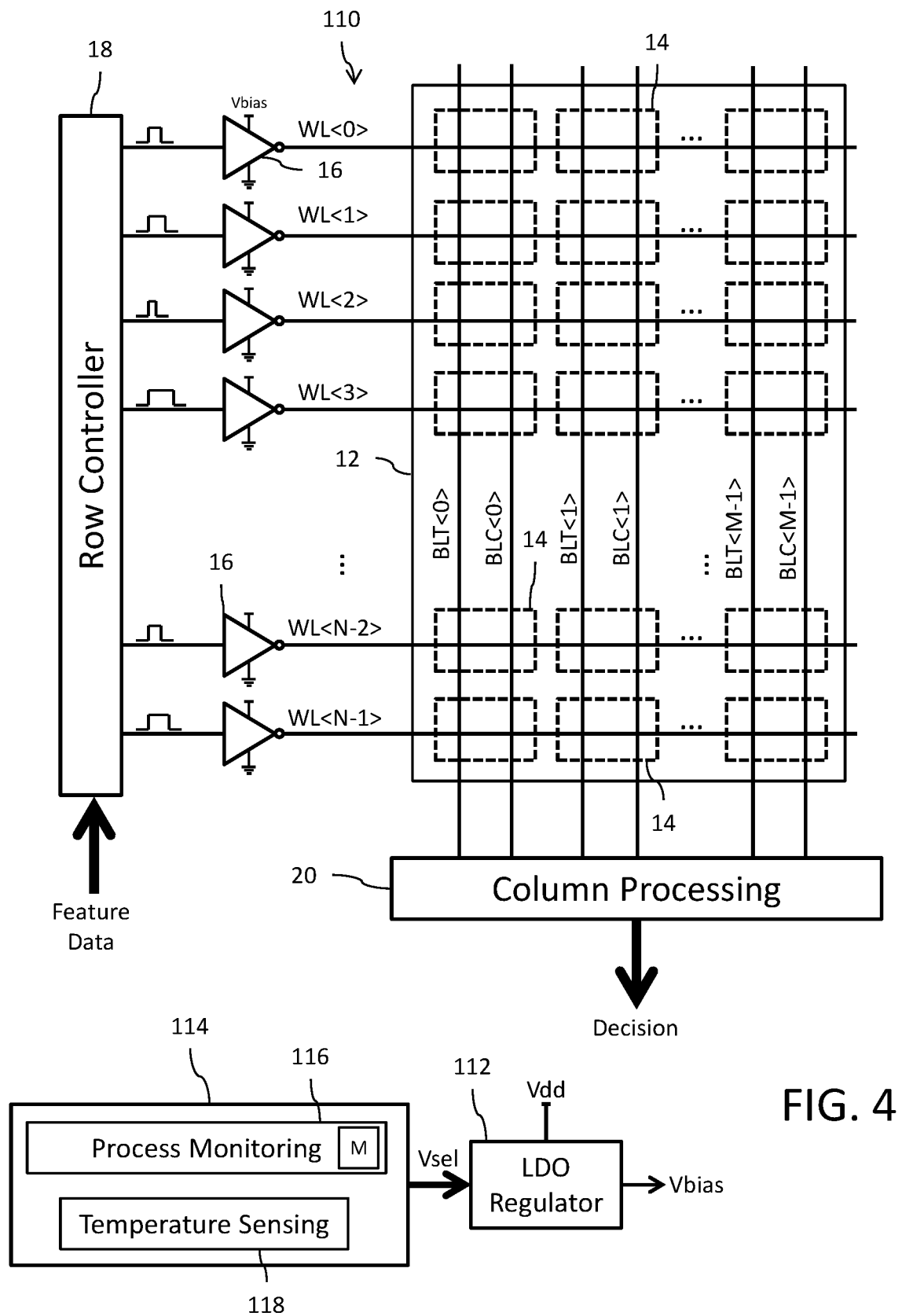
FIG. 4 is a schematic diagram of an in-memory computation circuit utilizing an adaptive supply voltage for word line driving.

Reference is now made to FIG. 4 which shows a schematic diagram of an in-memory computation circuit 110 utilizing an adaptive supply voltage Vbias for word line driving. Like references in FIGS. 1 and 4 refer to like or similar components, the description of which will not be repeated (see, description above). The circuit 110 differs from the circuit 10 in that the supply voltage for the word line driver circuit 16 is not fixed equal to Vdd (i.e., it is not the same as the array supply voltage) or set with a fixed word line under voltage level (for example, $V_{WLUD}$=Vdd/2). Instead, the supply voltage for the word line driver circuit 16 is an adaptive supply voltage Vbias that is modulated dependent on integrated circuit process and/or temperature conditions. The voltage level of this adaptive supply voltage Vbias is less than the supply voltage Vdd (used by the memory cells 14, for example) and is generated by a voltage generator circuit 112. In an embodiment, the voltage generator circuit 112 may comprise a voltage regulator such as a low drop-out (LDO) voltage regulator, which is a circuit well known to those skilled in the art.

The voltage generator circuit 112 receives the supply voltage Vdd and a control signal. In an embodiment, the control signal is a multi-bit digital control signal Vsel, but it will be understood that the control signal can instead be implemented as an analog signal. The value of the control signal (in particular, the digital values of the bits of the control signal Vsel) select the voltage level of the adaptive supply voltage Vbias output by the voltage generator circuit 112. The control signal Vsel is generated by a control circuit 114 in response to integrated circuit process and/or temperature information, and thus the voltage level of the adaptive supply voltage Vbias is modulated in a manner which is dependent on that integrated circuit process and/or temperature information.

The integrated circuit process information is a digital code generated and stored in a memory M within the control circuit 114. The digital code represents the centering of the process lot and is generated by circuitry such as, for example, ring oscillators (RO) whose output frequency varies dependent on integrated circuit process. The output frequencies of the RO circuits thus represent the process centering and can easily be converted into a digital code (for example, through the use of counter circuits). A process monitoring circuit 116 within the control circuit 114 can generate the value of the control signal Vsel as a function of the stored digital code for the integrated circuit process. For example, the process monitoring circuit 116 may include a look-up table (LUT) that correlates each digital code with a value of the control signal Vsel for providing a specific voltage level of the adaptive supply voltage Vbias that will produce an optimal level of word line underdrive for the integrated circuit process corner. The control circuit 114 outputs the value of the control signal Vsel correlated to the stored digital code and the voltage generator circuit 112 responds by generating the corresponding level for the adaptive supply voltage Vbias.

The temperature information is generated by a temperature sensing circuit 118 and represents a current temperature of the integrated circuit. The temperature sensing circuit 118 may select, modify or adjust the value of the control signal Vsel as a function of the sensed temperature. For example, the temperature sensing circuit 118 may include a look-up table (LUT) that specifies a certain (positive or negative) adjustment in the value of the control signal Vsel for providing a corresponding tuning of the specific voltage level of the adaptive supply voltage Vbias that will produce the optimal level of word line underdrive given the integrated circuit process corner and current temperature condition.

Figure 5:
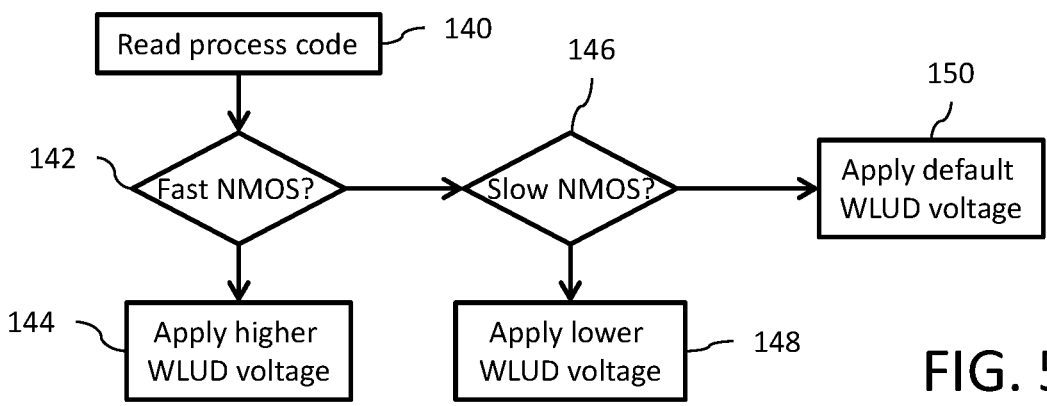
FIG. 5 is a flow diagram.

Reference is now made to FIG. 5 which shows a flow diagram for operation of the control circuit 114 and process monitoring circuit 116 for the circuit of FIG. 4. In step 140, the stored digital code for the integrated circuit process is read from the memory M. In an embodiment, the digital code for the integrated circuit process is loaded at the factory into the memory M, and this digital code is based on the identified integrated circuit process characteristic (fast/slow corner, etc.) for the integrated circuit fabrication lot (for example, the source wafer) from which the integrated circuit is obtained. Next, in step 142, a determination is made as to whether the read digital code for the integrated circuit process indicates that the n-channel MOSFET devices of the memory cells 12 are at the fast integrated circuit process corner (e.g., where NMOS speed is fast and PMOS speed is slow—the "FS" corner). If yes, then a value of the control signal Vsel is selected in step 144 which corresponds to the read digital code and which will cause the voltage generator circuit 112 to generate a higher degree of word line underdrive (i.e., the voltage level for the adaptive supply voltage Vbias will be lower than a nominal (or default) voltage level for word line underdrive). The effect of setting the adaptive supply voltage Vbias to a voltage level that is lower than the nominal (or default) voltage level is to reduce the multi row access write margin (MRAWM) which is the maximum level of the bit-line voltage needed to write into bit-cell. Reducing the MRAWM results in degradation of the write-ability of the bit cell and improvement of the data flip rate which are of concern at the fast NMOS corners. It will be understood by those skilled in the art that this is different from the normal Write Margin of the bit cell. This lower than nominal (or default) voltage level also enables a higher headroom for bit line swing, and as a result there is a higher precision for the bit line accumulation value in the in-memory compute operation. If no in step 142, then in step 146 a determination is made as to whether the read digital code for the integrated circuit process indicates that the n-channel MOSFET devices of the memory cells 12 are at the slow integrated circuit process corner (e.g., where NMOS speed is slow and PMOS speed is fast—the "SF" corner). If yes, then a value of the control signal Vsel is selected in step 148 which corresponds to the read digital code and which will cause the voltage generator circuit 112 to generate a lower degree of word line underdrive (i.e., the voltage level for the adaptive supply voltage Vbias is higher than the nominal (or default) voltage level for word line underdrive). The effect of setting the adaptive supply voltage Vbias to a voltage level that is higher than the nominal (or default) voltage level is to increase the multi row access write margin (MRAWM), resulting in an improved cell current while still controlling the data flip rate which is of less concern at slow NMOS corners. This higher than nominal (or default) voltage level also reduces the local variation effect of the slow process corner. If no in step 146, then in step 150 a value of the control signal Vsel is selected which corresponds to the read digital code and which will cause the voltage generator circuit 112 to generate a voltage level for the adaptive supply voltage Vbias that is equal to the nominal (or default) voltage level for word line underdrive.

Although the process of FIG. 5 contemplates three levels of voltage control (higher than, lower than, and equal to, nominal), it will be understood that this is by example only. Additional testing steps may be added to the process of FIG. 5 to test for other integrated circuit process corner or process-related conditions (for example, fast-fast (FF) and/or slow-slow (SS) corners), with each test having an associated digital code and value of the control signal Vsel for setting a corresponding voltage level of the adaptive supply voltage Vbias generated by the voltage generator circuit 112.

Figure 6:
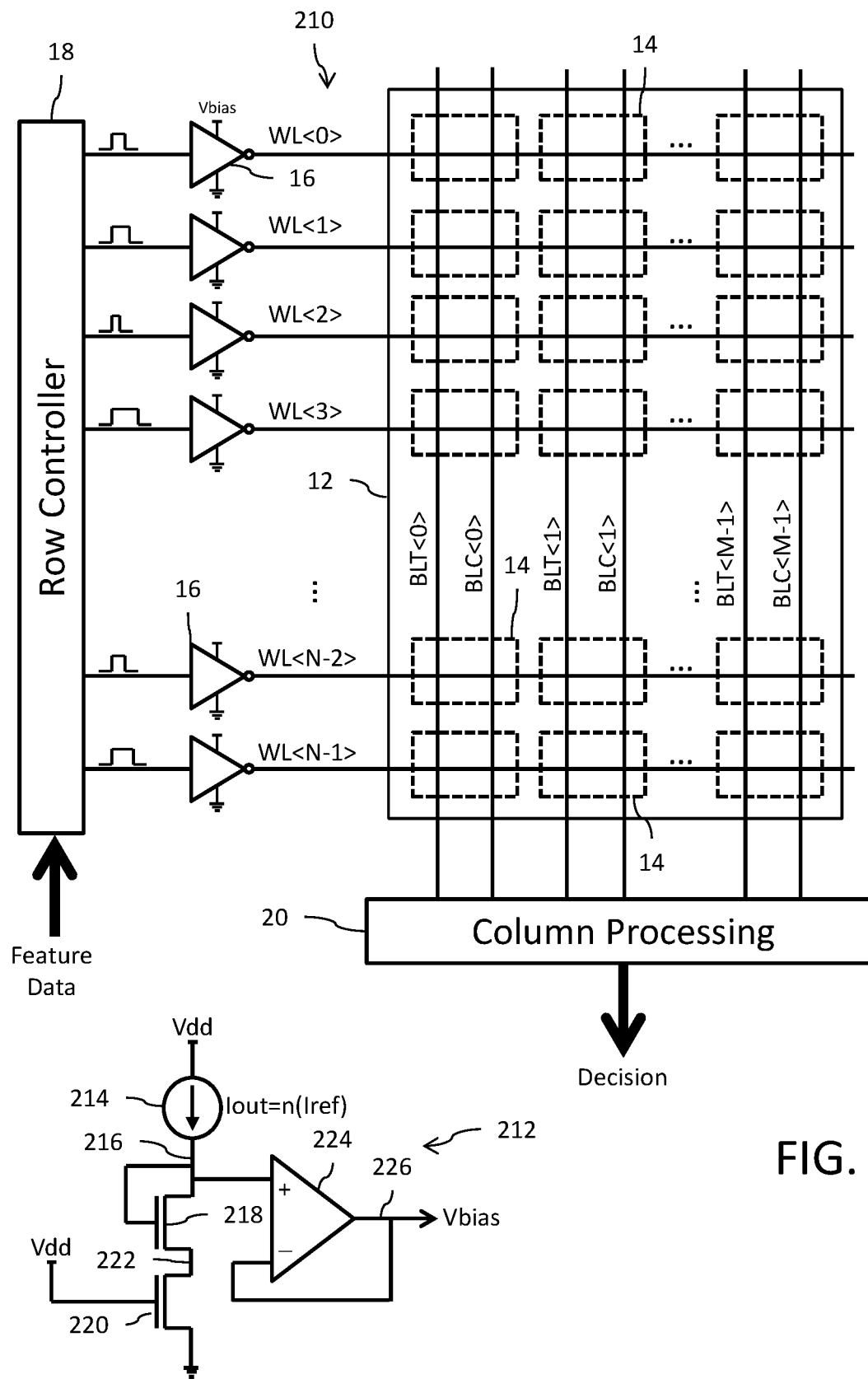
FIG. 6 is a schematic diagram of an in-memory computation circuit utilizing an adaptive supply voltage for word line driving.

Reference is now made to FIG. 6 which shows a schematic diagram of an in-memory computation circuit 210 utilizing an adaptive supply voltage Vbias for word line driving. Like references in FIGS. 1 and 6 refer to like or similar components, the description of which will not be repeated (see, description above). The circuit 210 differs from the circuit 10 in that the supply voltage for the word line driver circuit 16 is not fixed equal to Vdd (i.e., it is not the same as the array supply voltage) or set with a fixed word line under voltage level (for example, $V_{WLUD}$=Vdd/2). Instead, the supply voltage for the word line driver circuit 16 is an adaptive supply voltage Vbias modulated dependent on integrated circuit process conditions. The voltage level of this adaptive supply voltage Vbias is less than the supply voltage Vdd (used by the memory cells 14, for example) and is generated by a voltage generator circuit 212 with a voltage level that is proportional (by a factor of n) to a reference current Iref level. The reference current Iref has a magnitude defined by the fast NMOS process lot. As an example, the reference current Iref for a given bit cell is the current where MRAWM is zero while allowing for full rail-to-rail swing of bit lines at the worst process corner. The value of n for the proportionality factor is set by design and is based on a desired variability of the adaptive supply voltage Vbias level (such that n numbers of replica will effectively minimize the variation of Vbias due to local variation).

The voltage generator circuit 212 includes a current source 214 powered from the supply voltage Vdd and generating an output current Tout at node 216 where the current source is connected in series with the series connection of a first n-channel MOSFET device 218 and second n-channel MOSFET device 220. The output current Tout is applied (i.e., forced) to a circuit with transistors 218 and 220 to generate the bias voltage Vbias, wherein the transistors 218 and 220 effectively replicate the pass-gate and pull-down transistor configuration depicting the read condition of the memory cell. The first n-channel MOSFET device 218 has a drain coupled (preferably directly connected) to node 216 and a source coupled (preferably directly connected) to node 222. A gate of the first n-channel MOSFET device 218 is coupled (preferably directly connected) to the drain at node 216, thus configuring device 218 as a diode-connected transistor. The first n-channel MOSFET device 218 is a scaled replica of the n-channel transfer (passgate) transistors 26 and 28 within each memory cell 14, where the scaling factor is equal to n. In this context, "scaled replica" means that the transistor 218 is made identically using the same integrated circuit process materials and parameters (doping levels, oxide thickness, gate materials, etc.) as each of the transistors 26 and 28 but is an n times repetition of the single transistor providing an effectively larger width. As an example, the transistor 218 may be fabricated by connecting n transistors in parallel which are identical (matching) to each of the transistors 26 and 28. The second n-channel MOSFET device 220 has a drain coupled (preferably directly connected) to node 222 and a source coupled (preferably directly connected) to the ground supply reference. A gate of the second n-channel MOSFET device 220 is coupled (preferably directly connected) to receive the supply voltage Vdd. The second n-channel MOSFET device 220 is a scaled replica of the n-channel pulldown transistors 34 and 36 within each memory cell 14, where the scaling factor is equal to n. As an example, the transistor 220 may be fabricated by connecting n transistors in parallel which are identical (matching) to each of the transistors 34 and 36.

The bias voltage Vbias generated at node 216 is equal to:

$$Vbias=n(Iref)(Rdson218+Rdson220),$$

where: Rdson218 is the resistance from drain to source of the diode-connected first n-channel MOSFET device 218, and Rdson220 is the resistance from drain to source of the second n-channel MOSFET device 220 gate biased by supply voltage Vdd. The series connected transistors 218 and 220 replicate, subject to the scaling factor n, the current path in the memory cell 14 from the bit line (BLT or BLC) to ground in the operating condition where the pass gate transistor and its pull down transistor on one side of the memory cell are both turned on during the read operation.

A differential amplifier circuit 224 configured as a unity gain voltage follower receives the Vbias voltage at its non-inverting input and generates the Vbias voltage at its output 226 with sufficient drive capacity to power all of the word line driver circuits 16 for the simultaneously actuated word lines during an in-memory compute operation. The output of the differential amplifier circuit 224 is shorted to the inverting input.

Figure 7:
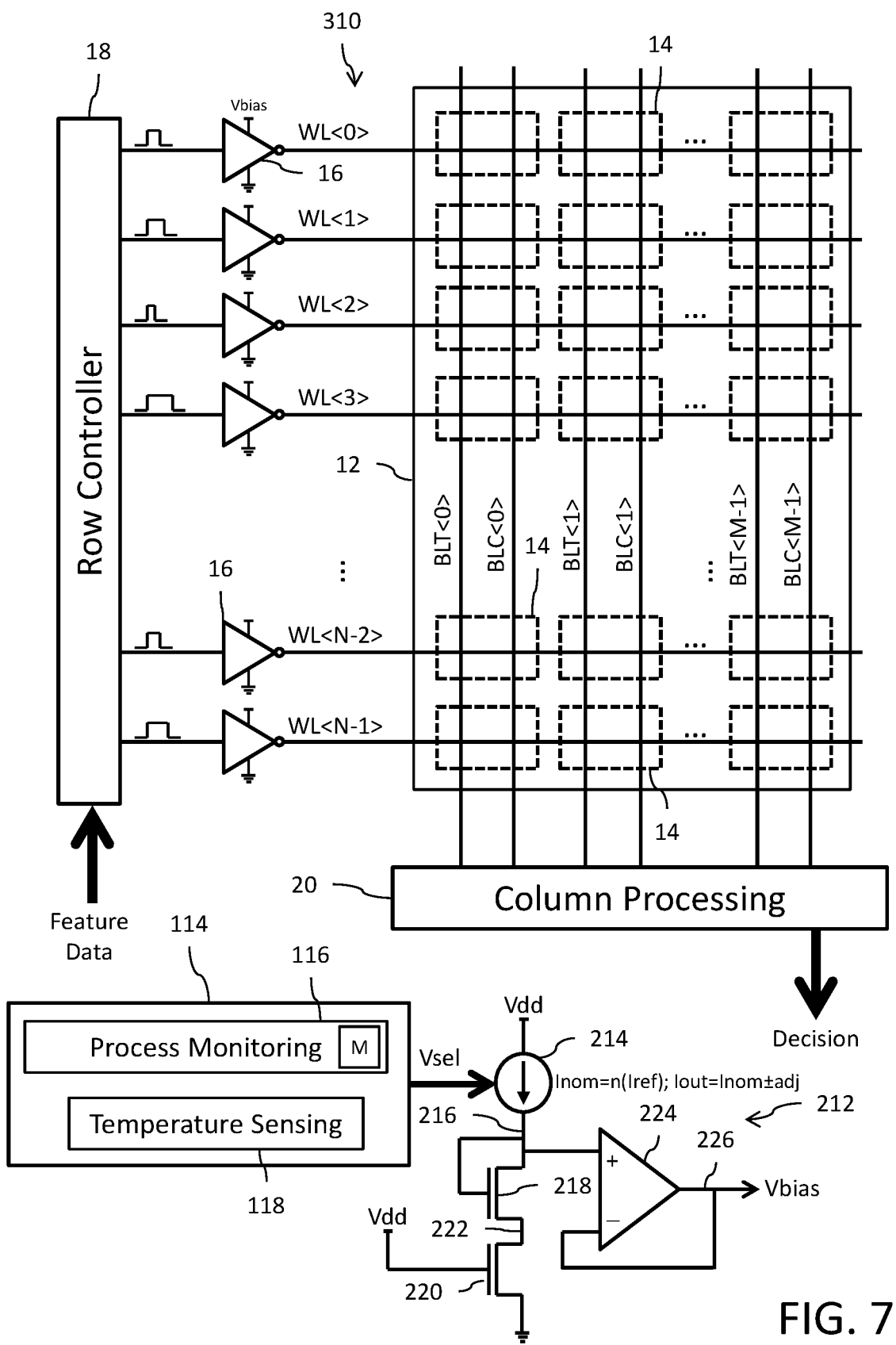
FIG. 7 is a schematic diagram of an in-memory computation circuit utilizing an adaptive supply voltage for word line driving.

Reference is now made to FIG. 7 which shows a schematic diagram of an in-memory computation circuit 310 utilizing an adaptive supply voltage Vbias for word line driving. Like references in FIGS. 6 and 7 refer to like or similar components, the description of which will not be repeated (see, description above). The circuit 310 differs from the circuit 210 in that a further integrated circuit process and/or temperature based tuning of the magnitude of the current Tout output by the current source 214 within the voltage generator circuit 212 is supported. In this context, the current source 214 is formed by a variable current source having a base (or nominal) current Inom magnitude equal to n(Iref) with a positive or negative adjustment adj from that base current magnitude level set by a control signal. In other words, the magnitude of the current output Tout by the current source 214 is equal to n(Iref)±adj, where adj is the adjustment set by the control signal. In an embodiment, the control signal is a multi-bit digital control signal Vsel, but it will be understood that the control signal can instead be implemented as an analog signal. The value of the control signal (in particular, the digital values of the bits of the control signal Vsel) selects the degree of adjustment made to the magnitude of the current output by the current source 214. The control signal Vsel is generated by a control circuit 114 in response to integrated circuit process and/or temperature information. Thus, the level of the adaptive supply voltage Vbias is now additionally dependent on that integrated circuit process and/or temperature information.

The integrated circuit process information is a digital code generated and stored in a memory M within the control circuit 114. The digital code represents the centering of the process lot and is generated by circuitry such as, for example, ring oscillators (RO) whose output frequency varies dependent on integrated circuit process. The output frequencies of the RO circuits thus represent the process centering and can easily be converted into a digital code (for example, through the use of counter circuits). A process monitoring circuit 116 within the control circuit 114 can generate the value of the control signal Vsel as a function of the stored digital code for the integrated circuit process. For example, the process monitoring circuit 116 may include a look-up table (LUT) that correlates each digital code with a value of the control signal Vsel for selecting the positive or negative adjustment adj of the nominal magnitude of the current generated by the current source 214 to ensure that the voltage level of the adaptive supply voltage Vbias will produce the optimal level of word line underdrive for the integrated circuit process corner. The control circuit 114 outputs the value of the control signal Vsel correlated to the digital code and the voltage generator circuit 212 responds by generating the corresponding voltage level for the adaptive supply voltage Vbias.

The temperature information is generated by a temperature sensing circuit 118 and represents a current temperature of the integrated circuit. The temperature sensing circuit 118 may modify or adjust the value of the control signal Vsel as a function of the sensed temperature. For example, the temperature sensing circuit 118 may include a look-up table (LUT) that specifies a certain adjustment in the value of the control signal Vsel for providing a corresponding tuning of the magnitude of the current output by the current source 214 to ensure that the level of the adaptive supply voltage Vbias will produce the optimal level of word line underdrive given the integrated circuit process corner and current temperature condition.

Reference is now made to FIG. 5 which shows a flow diagram for operation of the control circuit 114 and process monitoring circuit 116 for the circuit of FIG. 7. In step 140, the stored digital code for the integrated circuit process is read from the memory M. In an embodiment, the digital code for the integrated circuit process is loaded at the factory into the memory M, and this digital code is based on the identified integrated circuit process characteristic (fast/slow corner, etc.) for the integrated circuit fabrication lot (for example, the source wafer) from which the integrated circuit is obtained. Next, in step 142, a determination is made as to whether the read digital code for the integrated circuit process indicates that the n-channel MOSFET devices of the memory cells 12 are at the fast integrated circuit process corner (i.e., where and NMOS speed is fast and PMOS speed is slow—the "FS" corner). If yes, then a value of the control signal Vsel is selected in step 144 which corresponds to the read digital code and which will cause a negative adjustment adj in the magnitude of the current output by the current source 214 so that the voltage regulator circuit 212 will produce a higher degree of word line underdrive (i.e., the level for the adaptive supply voltage Vbias will be lower than a nominal (or default) level for word line underdrive set by the nominal current magnitude n(Iref)). The effect of setting the adaptive supply voltage Vbias to a voltage level that is lower than the nominal (or default) voltage level is to reduce the multi row access write margin (MRAWM) which is the maximum level of the bit-line voltage needed to write into bit-cell. Reducing the MRAWM results in degradation of the write-ability of the bit cell and improvement of the data flip rate which are of concern at the fast NMOS corners. This lower than nominal (or default) voltage level also enables a higher headroom for bit line swing, and as a result there is a higher precision for the bit line accumulation value in the in-memory compute operation. If no in step 142, then in step 146 a determination is made as to whether the read digital code for the integrated circuit process indicates that the n-channel MOSFET devices of the memory cells 12 are at the slow integrated circuit process corner (i.e., where NMOS speed is slow and PMOS speed is fast—the "SF" corner). If yes, then a value of the control signal Vsel is selected in step 148 which corresponds to the read digital code and which will cause a positive adjustment adj in the magnitude of the current output by the current source 214 so that the voltage regulator circuit 212 will produce a lower degree of word line underdrive (i.e., the level for the adaptive supply voltage Vbias is higher than the nominal (or default) level for word line underdrive set by the nominal current magnitude n(Iref)). The effect of setting the adaptive supply voltage Vbias to a voltage level that is higher than the nominal (or default) voltage level is to increase the multi row access write margin (MRAWM), resulting in an improved cell current while still controlling the data flip rate which is of less concern at slow NMOS corners. This higher than nominal (or default) voltage level also reduces the local variation effect of the slow process corner. If no in step 146, then in step 150 a value of the control signal Vsel is selected which corresponds to the read digital code and which will cause no adjustment (i.e., adj=0) in the n(Iref) magnitude of the current output by the current source 214 so that the voltage regulator circuit 212 will produce a level for the adaptive supply voltage Vbias that is equal to the nominal (or default) level for word line underdrive as set by the nominal current Inom.

Although the process of FIG. 5 contemplates three levels of voltage control (higher than, lower than, and equal to, nominal), it will be understood that this is by example only. Additional testing steps may be added to the process of FIG. 5 to test for other integrated circuit process corner or process-related conditions (for example, fast-fast (FF) and/or slow-slow (SS) corners), with each test having an associated digital code and value of the control signal Vsel for setting a corresponding level of the adjustment for the current output by the current source 214 of the voltage generator circuit 212.

Figure 8:
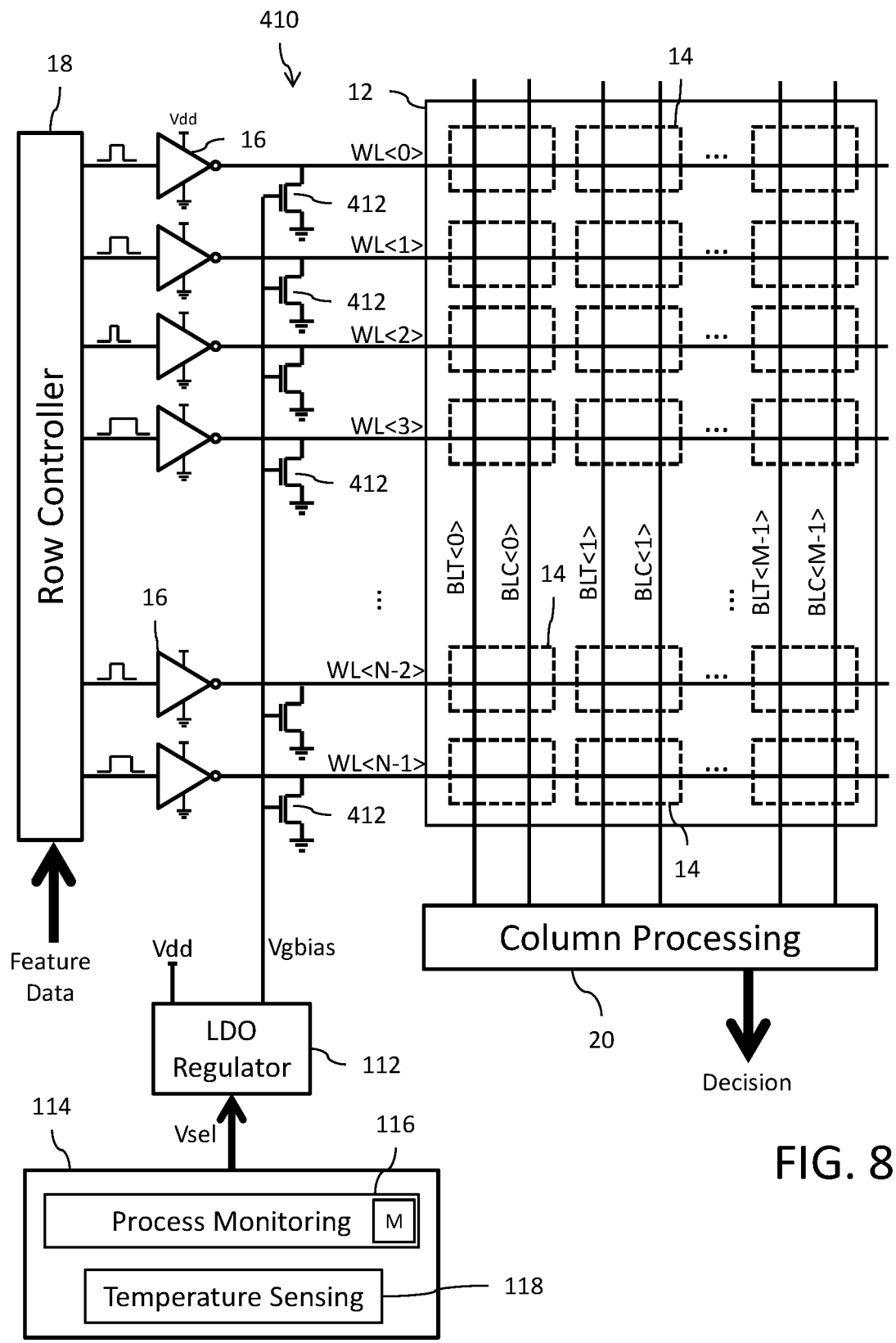
FIG. 8 is a schematic diagram of an in-memory computation circuit utilizing an adaptive word line underdrive bias voltage.

Reference is now made to FIG. 8 which shows a schematic diagram of an in-memory computation circuit 410 utilizing an integrated circuit process and/or temperature dependent word line underdrive. Like references in FIGS. 1 and 8 refer to like or similar components, the description of which will not be repeated (see, description above). The circuit 410 differs from the circuit 10 in the inclusion, for each word line, of a bleeder (n-channel pull down) MOSFET device 412 having a source-drain path coupled between the word line and the ground reference and a gate coupled to receive an adaptive gate bias voltage Vgbias modulated dependent on integrated circuit process and/or temperature conditions to control the applied level of word line underdrive. The adaptive gate bias voltage Vgbias is generated by a voltage generator circuit 112. In an embodiment, the voltage generator circuit 112 may comprise a voltage regulator such as a low drop-out (LDO) voltage regulator, which is a circuit well known to those skilled in the art.

The voltage generator circuit 112 receives the supply voltage Vdd and a control signal. In an embodiment, the control signal is a multi-bit digital control signal Vsel, but it will be understood that the control signal can instead be implemented as an analog signal. The value of the control signal (in particular, the digital values of the bits of the control signal Vsel) selects the level of the adaptive gate bias voltage Vgbias output by the voltage generator circuit 112. The control signal Vsel is generated by a control circuit 114 in response to integrated circuit process and/or temperature information. The level of the adaptive gate bias voltage Vgbias controls the conductivity of the bleeder transistors 412 and thus the applied level of word line underdrive is dependent on that integrated circuit process and/or temperature information.

The integrated circuit process information is a digital code generated and stored in a memory M within the control circuit 114. The digital code represents the centering of the process lot and is generated by circuitry such as, for example, ring oscillators (RO) whose output frequency varies dependent on integrated circuit process. The output frequencies of the RO circuits thus represent the process centering and can easily be converted into a digital code (for example, through the use of counter circuits). A process monitoring circuit 116 within the control circuit 114 can generate the value of the control signal Vsel as a function of the stored digital code for the integrated circuit process. For example, the process monitoring circuit 116 may include a look-up table (LUT) that correlates each digital code with a value of the control signal Vsel for providing a specific voltage level of the adaptive gate bias voltage Vbias that will produce an optimal level of word line underdrive for the integrated circuit process corner. The control circuit 114 outputs the value of the control signal Vsel correlated to the digital code and the voltage generator circuit 112 responds by generating the corresponding voltage level for the adaptive gate bias voltage Vgbias.

The temperature information is generated by a temperature sensing circuit 118 and represents a current temperature of the integrated circuit. The temperature sensing circuit 118 may modify or adjust the value of the control signal Vsel as a function of the sensed temperature. For example, the temperature sensing circuit 118 may include a look-up table (LUT) that specifies a certain adjustment in the value of the control signal Vsel for providing a corresponding tuning of the specific voltage level of the adaptive gate bias voltage Vgbias that will produce the optimal level of word line underdrive given the integrated circuit process corner and current temperature condition.

Reference is now made to FIG. 5 which shows a flow diagram for operation of the control circuit 114 and process monitoring circuit 116 for the circuit of FIG. 8. In step 140, the stored digital code for the integrated circuit process is read from the memory M. In an embodiment, the digital code for the integrated circuit process is loaded at the factory into the memory M, and this digital code is based on the identified integrated circuit process characteristic (fast/slow corner, etc.) for the integrated circuit fabrication lot (for example, the source wafer) from which the integrated circuit is obtained. Next, in step 142, a determination is made as to whether the read digital code for the integrated circuit process indicates that the n-channel MOSFET devices of the memory cells 12 are at the fast integrated circuit process corner (i.e., where and NMOS speed is fast and PMOS speed is slow—the "FS" corner). If yes, then a value of the control signal Vsel is selected in step 144 which corresponds to the read digital code and which will cause the voltage generator circuit 112 to generate a higher degree of word line underdrive (i.e., the level for the adaptive gate bias voltage Vgbias will be higher than a nominal (or default) level for word line underdrive). If no in step 142, then in step 146 a determination is made as to whether the read digital code for the integrated circuit process indicates that the n-channel MOSFET devices of the memory cells 12 are at the slow integrated circuit process corner (i.e., where NMOS speed is slow and PMOS speed is fast—the "SF" corner). If yes, then a value of the control signal Vsel is selected in step 148 which corresponds to the read digital code and which will cause the voltage generator circuit 112 to generate a lower degree of word line underdrive (i.e., the level for the adaptive gate bias voltage Vgbias is lower than the nominal (or default) level for word line underdrive). If no in step 146, then in step 150 a value of the control signal Vsel is selected which corresponds to the read digital code and which will cause the voltage generator circuit 112 to generate a level for the adaptive supply voltage Vgbias that is equal to the nominal (or default) level for word line underdrive.

Although the process of FIG. 5 contemplates three levels of voltage control (higher than, lower than, and equal to, nominal), it will be understood that this is by example only. Additional testing steps may be added to the process of FIG. 5 to test for other integrated circuit process corner or process-related conditions (for example, fast-fast (FF) and/or slow-slow (SS) corners), with each test having an associated digital code and value of the control signal Vsel for setting a corresponding level of the adaptive gate bias voltage Vgbias generated by the voltage generator circuit 112.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. An in-memory computation circuit, comprising:
   a memory array including a plurality of static random access memory (SRAM) cells arranged in a matrix with plural rows and plural columns, each row including a word line connected to the SRAM cells of the row, and each column including at least one bit line connected to the SRAM cells of the column;
   a word line drive circuit for each row having an output connected to drive the word line of the row, wherein the word line drive circuit is powered by an adaptive supply voltage;
   a row controller circuit configured to simultaneously actuate the plurality of word lines by applying pulses through the word line driver circuits to the word lines for an in-memory compute operation;
   a column processing circuit connected to the at least one line for each column and configured to process analog voltages developed on the bit lines in response to the simultaneous actuation of the plurality of word lines to generate a decision output for the in-memory compute operation; and
   a voltage generator circuit configured to generate the adaptive supply voltage for powering the word line drive circuits during the simultaneous actuation of the plurality of word lines for the in-memory compute operation, said adaptive supply voltage having a level which is dependent on integrated circuit process conditions;
   wherein the voltage generator circuit comprises:
      a control circuit configured to generate a control signal;
      wherein the control signal is configured to cause modulation of the level of the adaptive supply voltage away from a nominal level in response to an applicable integrated circuit process corner for transistor devices of the SRAM cells.

2. The in-memory computation circuit of claim 1, wherein the voltage generator circuit is an adjustable voltage regulator controlled to generate the level of the adaptive supply voltage, and wherein the control signal is applied to the voltage generator circuit.

3. The in-memory computation circuit of claim 2, wherein the applicable integrated circuit process corner is indicated by a programmed code stored in the control circuit, and wherein the control circuit includes a lookup table (LUT) correlating the programmed code to a value of the control signal.

4. The in-memory computation circuit of claim 2, wherein the control circuit further comprises a temperature sensor, and wherein the control signal is configured to cause a temperature dependent tuning of the level of the adaptive supply voltage set in response to the applicable integrated circuit process corner.

5. The in-memory computation circuit of claim 4, wherein the control circuit includes a lookup table (LUT) correlating sensed integrated circuit temperature to a tuning level for the value of the control signal.

6. The in-memory computation circuit of claim 2, wherein the control circuit further comprises a temperature sensor, and wherein the control signal is configured to cause modulation of the level of the adaptive supply voltage away from the nominal level in response to an integrated circuit temperature sensed by the temperature sensor.

7. The in-memory computation circuit of claim 6, wherein the control circuit includes a lookup table (LUT) correlating sensed integrated circuit temperature to a value of the control signal.

8. The in-memory computation circuit of claim 1, wherein the voltage generator circuit comprises:
   a current source configured to generate a current applied to a first node; and
   a series connection of a first and second transistor between the first node and a reference node;
   wherein the adaptive supply voltage is generated at said first node;
   wherein the first transistor is a replica of a passgate transistor within the SRAM cell;
   wherein the second transistor is a replica of a pull down transistor within the SRAM cell.

9. The in-memory computation circuit of claim 8, wherein the current generated by the current source has a magnitude set as a function of a reference current representative of current flowing through the passgate transistor and the pull down transistor for an applicable integrated circuit process corner.

10. The in-memory computation circuit of claim 9, wherein the magnitude of the current generated by the current source is scaled by a factor applied to the reference current.

11. The in-memory computation circuit of claim 10, wherein the first transistor is scaled by said factor for the replica of the passgate transistor and wherein the second transistor is scaled by said factor for the replica of the pull down transistor.

12. The in-memory computation circuit of claim 8, further comprising an amplifier circuit having an input coupled to said first node and an output coupled to power the word line drive circuits.

13. The in-memory computation circuit of claim 8, wherein the current source is controlled by the control signal to generate an adjustment to the current applied to the first node.

14. The in-memory computation circuit of claim 13, wherein the control signal is configured to cause modulation of a level of the current away from a nominal current level.

15. The in-memory computation circuit of claim 14, wherein the applicable integrated circuit process corner is indicated by a programmed code stored in the control circuit; and wherein the control circuit includes a lookup table (LUT) correlating the programmed code to a value of the control signal.

16. The in-memory computation circuit of claim 14, wherein the control circuit further comprises a temperature sensor, and wherein the control signal is configured to cause a temperature dependent tuning of the level of the current set in response to the applicable integrated circuit process corner.

17. The in-memory computation circuit of claim 16, wherein the control circuit includes a lookup table (LUT) correlating sensed integrated circuit temperature to a tuning level for the value of the control signal.

18. The in-memory computation circuit of claim 13, wherein the control circuit further comprises a temperature sensor, and wherein the control signal is configured to cause modulation of the level of the current away from a nominal current level in response to an integrated circuit temperature sensed by the temperature sensor.

19. The in-memory computation circuit of claim 18, wherein the control circuit includes a lookup table (LUT) correlating sensed integrated circuit temperature to a value of the control signal.

20. An in-memory computation circuit, comprising:
- a memory array including a plurality of static random access memory (SRAM) cells arranged in a matrix with plural rows and plural columns, each row including a word line connected to the SRAM cells of the row, and each column including at least one bit line connected to the SRAM cells of the column;
- a word line drive circuit for each row having an output connected to drive the word line of the row, wherein the word line drive circuit is powered by an adaptive supply voltage;
- a row controller circuit configured to simultaneously actuate the plurality of word lines by applying pulses through the word line driver circuits to the word lines for an in-memory compute operation;
- a column processing circuit connected to the at least one bit line for each column and configured to process analog voltages developed on the bit lines in response to the simultaneous actuation of the plurality of word lines to generate a decision output for the in-memory compute operation;
- a replica circuit that replicates a passgate transistor and pull down transistor of the SRAM cells;
- a current generator controlled to generate an adjustment to a force current which is applied to the replica circuit to generate a bias voltage; and
- a voltage circuit configured to use the bias voltage to generate the adaptive supply voltage for powering the word line drive circuits during the simultaneous actuation of the plurality of word lines for the in-memory compute operation, said adaptive supply voltage having a level which is dependent on integrated circuit process and/or temperature conditions; and
- a control circuit configured to generate a control signal for application to the current generator;
- wherein the control signal is configured to cause modulation of a level of the force current away from a nominal level in response to an applicable integrated circuit process corner for transistor devices of the SRAM cells.

21. The in-memory computation circuit of claim 20, wherein the voltage circuit is a voltage buffer.

22. The in-memory computation circuit of claim 20, wherein the force current generated by the current source has a magnitude set as a function of a reference current representative of current flowing through the passgate transistor and pull down transistor of the SRAM cells for an applicable integrated circuit process corner.

23. The in-memory computation circuit of claim 22, wherein the magnitude of the current generated by the current source is scaled by a factor applied to the reference current.

24. The in-memory computation circuit of claim 23, wherein the replica circuit is scaled by said factor.

25. The in-memory computation circuit of claim 20, wherein the applicable integrated circuit process corner is indicated by a programmed code stored in the control circuit, and wherein the control circuit includes a lookup table (LUT) correlating the programmed code to a value of the control signal.

26. The in-memory computation circuit of claim 20, wherein the control circuit further comprises a temperature sensor, and wherein the control signal is configured to cause a temperature dependent tuning of the level of the force current set in response to applicable integrated circuit process corner.

27. The in-memory computation circuit of claim 26, wherein the control circuit includes a lookup table (LUT) correlating sensed integrated circuit temperature to a tuning level for the value of the control signal.

28. The in-memory computation circuit of claim 20, wherein the control circuit further comprises a temperature sensor, and wherein the control signal is configured to cause modulation of the level of the force current away from a nominal level in response to an integrated circuit temperature sensed by the temperature sensor.

29. The in-memory computation circuit of claim 28, wherein the control circuit includes a lookup table (LUT) correlating sensed integrated circuit temperature to a value of the control signal.

30. The in-memory computation circuit of claim 20, wherein the replica circuit comprises a series connection of a first transistor and a second transistor, wherein the first transistor is a replica of the passgate transistor within the SRAM cell, and wherein the second transistor is a replica of the pull down transistor within the SRAM cell.

* * * * *